United States Patent [19]

Koshikawa et al.

[11] Patent Number: 5,361,000
[45] Date of Patent: Nov. 1, 1994

[54] REFERENCE POTENTIAL GENERATING CIRCUIT

[75] Inventors: Yasuji Koshikawa; Tadahiko Sugibayashi, both of Tokyo, Japan

[73] Assignee: NEC Corporation, Tokyo, Japan

[21] Appl. No.: 935,209

[22] Filed: Aug. 26, 1992

[30] Foreign Application Priority Data

Aug. 26, 1991 [JP] Japan .................. 3-212543

[51] Int. Cl.⁵ .............................. H03K 3/01
[52] U.S. Cl. .................... 327/530; 365/226; 327/541; 327/544
[58] Field of Search ............. 307/296.1, 296.4, 296.5, 307/296.6, 296.8, 296.3, 272.3; 365/227, 226

[56] References Cited

U.S. PATENT DOCUMENTS

| | | | |
|---|---|---|---|
| 4,477,737 | 10/1984 | Ulmer et al. | 307/296.6 |
| 4,683,382 | 7/1987 | Sukurai et al. | 307/296.3 |
| 5,063,304 | 11/1991 | Iyengar | 307/296.6 |
| 5,109,187 | 4/1992 | Guliani | 307/296.6 |
| 5,144,585 | 9/1992 | Min et al. | 365/227 |

*Primary Examiner*—Timothy P. Callahan
*Assistant Examiner*—Toan Tran
*Attorney, Agent, or Firm*—Sughrue, Mion, Zinn, Macpeak & Seas

[57] ABSTRACT

A reference potential generating circuit includes a plurality of MOS field effect transistors and a reference potential driver circuit. The MOS field effect transistors have different threshold voltages and a reference potential is obtained by amplifying the threshold voltage difference of the MOS field effect transistors. During the period in which a power supply potential externally supplied is lower than a predetermined target value of the reference potential, the reference potential driver circuit drives an output terminal for producing a potential corresponding to the power supply potential supplied externally. In this reference potential generating circuit, the S/N ratio is good and the circuit operation is stable, and is effective for reducing the power consumption and for increasing the integration density in semiconductor integrated circuit devices.

2 Claims, 5 Drawing Sheets

REFERENCE POTENTIAL GENERATING CIRCUIT

BACKGROUND OF THE INVENTION

Field of the Invention

The present invention relates to a reference potential generating circuit, and more particularly to a reference potential generating circuit for use in a semiconductor integrated circuit such as a memory of the type used by internally dropping a power supply voltage externally supplied.

Description of the Related Art

In recent years, for purposes of reducing power consumption and enhancing high integration density in a semiconductor integrated circuit such as a semiconductor memory device, there is an increase in use of an arrangement in which an externally supplied power voltage is dropped within a chip and a reference potential thus generated is used as a power source.

An example of a conventional reference potential generating circuit of the kind to which the present invention relates is shown in FIG. 1A. In the reference potential generating circuit shown in FIG. 1A, a threshold potential difference $\Delta V_{TP}$ between two P-channel MOS field effect transistors (hereinafter referred to as "PMOS transistors") whose threshold voltages are different from each other is produced by a $\Delta V_{TP}$ potential generating circuit 1. The potential $V_3$ ($=\Delta V_{TP}$) which is produced by the $\Delta V_{TP}$ potential generating circuit 1 is input to a comparator 2. An output terminal 3 of the reference potential generating circuit is driven by a PMOS transistor $Q_3$ which receives at its gate an output from the comparator 2. The reference potential $V_{REF}$ which is output from the output terminal 3 is expressed as follows:

$$V_{REF} = \{(R_1 + R_2)/R_2\} \cdot V_3 \text{(V)} \quad (1)$$

wherein the resistance values of a resistor $R_1$ and a resistor $R_2$ are $R_1$ ($\Omega$) and $R_2$ ($\Omega$), respectively.

FIG. 1B is a circuit diagram showing an example of the $\Delta V_{TP}$ potential generating circuit 1. In the $\Delta V_{TP}$ potential generating circuit 1 shown in FIG. 1B, there are three PMOS transistors $Q_{10}$, $Q_{11}$ and $Q_{12}$ which are connected in series between a power supply terminal 4 and a ground terminal 5 and which produce a voltage whose potential is lower than the power supply voltage $V_{CC}$ by two times the threshold voltage $|V_{TP}|$ of the PMOS transistor. The potential thus produced is input to the gates of three PMOS transistors $Q_{13}$, $Q_{16}$ and $Q_{20}$ which have the same operating capacity. Since the gate potentials of the PMOS transistors $Q_{13}$, $Q_{16}$ and $Q_{20}$ are the same, the source-drain currents are the same respectively.

Further, as to an N-channel MOS field effect transistor (hereinafter referred to as "NMOS transistor") $Q_{21}$ which is provided in series with the PMOS transistor $Q_{20}$ and an NMOS transistor $Q_{19}$ since these transistors are made to have the same operating capacity and have gates connected with each other, the respective source-drain currents coincide with each other.

That is, the source-drain currents all coincide among the PMOS transistor $Q_{14}$ which is connected in series with the PMOS transistor $Q_{13}$ and other PMOS transistors including the PMOS transistor $Q_{17}$ connected in series with the PMOS transistor $Q_{16}$ namely, the PMOS transistors $Q_{13}$, $Q_{14}$, $Q_{16}$, $Q_{17}$ and $Q_{20}$ as well as the NMOS transistors $Q_{19}$ and $Q_{21}$.

In the above circuit configuration, the value of the threshold voltage of the PMOS transistor $Q_{14}$ is made to be larger than that of the threshold voltage of the other PMOS transistors. Then, when the power supply voltage $V_{CC}$ becomes larger than the threshold voltage of the PMOS transistor $Q_{14}$, the output voltage $V_3$ of the $\Delta V_{TP}$ potential generating circuit 1 results in $$V_3 = \Delta V_{TP} \text{(V)},$$

with the $\Delta V_{TP}$ being the potential difference between the threshold voltage of the transistor $Q_{14}$ and that of the transistor $Q_{17}$.

Next, to facilitate the related explanation to be made later, consideration is now given to the relation between the power supply voltage $V_{CC}$ and the reference potential $V_{REF}$ in the reference potential generating circuit having the $\Delta V_{TP}$ potential generating circuit 1 described above. In the graph shown in FIG. 2, the solid line shows the relation between the power supply voltage $V_{CC}$ and the reference potential $V_{REF}$ in the case where the threshold voltages $-V_{TP14}$, $= -V_{TP17}$ of the PMOS transistors $Q_{14}$, $Q_{17}$ are $-V_{TP14} = -1.50$ (V) and $-V_{TP17} = -0.75$ (V), respectively, and $R_1:R_2 = 2.55:0.75$.

In light of FIGS. 1A, 1B and FIG. 2, it is noted that the power supply voltage $V_{CC}$ starts to rise from 0 (V) and, upon reaching 0.75 (V), causes the PMOS transistors $Q_{13}$, $Q_{16}$ and $Q_{20}$ to start flowing their source-drain currents whereby the output potential $V_3$ starts to rise. Subsequently, the power supply voltage $V_{CC}$ rises further and, upon reaching 1.50 (V), causes the PMOS transistor $Q_{14}$ to start flowing its source-drain current and the output potential results in $V_3 = \Delta V_{TP} = 0.75$ (V). Further, when the power supply voltage $V_{CC}$ reaches or becomes larger than the voltage which is determined by the equation (1) given above, the voltage being $\{(R_1+R_2)/R_2\}V_3 = \}(2.55+0.75)/0.75\} \times 0.75 = 3.3$ (V), then the reference potential $V_{REF}$ becomes stable at $V_{REF} = 3.3$ (V).

As explained above, the conventional reference potential generating circuit is so arranged that the threshold voltage difference of the PMOS transistors having threshold voltages different from each other is differentially amplified by the comparator to obtain the reference potential.

Therefore, from the stand point of signal/noise (S/N) ratio. It is desirable that the threshold potential difference $\Delta V_{TP}$ be made large and the amplification factor be made small. However, since the threshold voltages of the PMOS transistors are determined by their structural and manufacturing conditions, there is a limit in the threshold potential differences which are obtainable therefrom.

As an alternative approach for obtaining a large threshold potential difference, a method available is to make a circuitry modification to such $\Delta V_{TP}$ potential generating circuit as shown in FIG. 1B. That is, whereas, in the above $\Delta V_{TP}$ potential generating circuit, the threshold voltage difference is derived from a threshold voltage difference of the PMOS transistors $Q_{14}$ and $Q_{17}$ and the output voltage obtained is $\Delta V_{TP} = (V_{TP14} - V_{TP17})$, these PMOS transistors may be stacked in a plurality thereof which result in a threshold voltage difference of $n(V_{TP14} - V_{TP17})$ wherein "n" represents the stack number of the PMOS transistors.

With the conventional reference potential generating circuit. When the threshold voltage difference is made large as explained above, there is a problem in that the circuit after the power being switched on may not operate properly until the power supply voltage becomes stable at a predetermined value. This problem is explained hereinafter.

It is now assumed that the $\Delta V_{TP}$ potential generating circuit in this example is one in which the PMOS transistors for determining threshold voltage differences are stacked in two. Such $\Delta V_{TP}$ potential generating circuit (hereinafter referred to as "$2\Delta V_{TP}$ potential generating circuit") is shown in a circuit diagram of FIG. 3. As shown therein, the difference in this $2\Delta V_{TP}$ potential generating circuit from the $\Delta V_{TP}$ potential generating circuit shown in FIG. 1B is the arrangement wherein a PMOS transistor $Q_{15}$ is connected between the PMOS transistor $Q_{14}$ and the ground terminal 5 and also a PMOS transistor $Q_{18}$ is connected in series with the PMOS transistor $Q_{17}$.

In this $2\Delta V_{TP}$ potential generating circuit, the source-drain currents of all of the PMOS transistors $Q_{13}$, $Q_{16}$ and $Q_{20}$ and the NMOS transistors $Q_{19}$ and $Q_{21}$ are the same as in the previously described $\Delta V_{TP}$ potential generating circuit. Further, once the power supply voltage exceeds a certain value, the output potential $V_3$ becomes $V_3 = V_{TP14} = V_{TP15} - V_{TP17} - V_{TP18}$ (V) with the threshold voltages of the PMOS transistors $Q_{14}$, $Q_{15}$, $Q_{17}$ and $Q_{18}$ being $-V_{TP14}$, $-V_{TP15}$, $-V_{TP17}$ and $-V_{TP18}$, respectively.

When the $2\Delta V_{TP}$ potential generating circuit as described above is used, the relation between the output potential of the reference potential generating circuit and the power supply voltage $V_{CC}$ will be as shown in a dotted line in the graph of FIG. 2. In this case, in the arrangements shown in FIG. 1A and FIG. 3, the threshold voltage of each of the PMOS transistors $Q_{12}$, $Q_{14}$ and $Q_{15}$ is made $-1.50$ (V) and that of each of the other PMOS transistors is made $-0.75$ (V). This means that $\Delta V_{TP}=0.75$ (V). Also, the ratio between the resistance value $R_1$ and that of $R_2$ is $R_1:R_2=1.8:1.5$. The reason that the threshold voltage of the PMOS transistor $Q_{12}$ is made large is for making the power consumption small.

With reference to FIG. 1A, FIG. 2 and FIG. 3, the reference potential $V_{REF}$ at the output terminal 3 which is driven by the $2\Delta V_{TP}$ potential generating circuit starts to rise when the magnitude of the threshold voltage of the PMOS transistor $Q_{12}$ and that of the power supply voltage $V_{CC}$ become the same (i.e., $V_{CC}=1.5V$). When the power supply voltage $V_{CC}$ becomes equal to the sum value ($=3.0$ V) of the threshold voltages of the PMOS transistors $Q_{14}$ and $Q_{15}$, respectively, the output potential $V_3$ becomes $V_3 = 2\Delta V_{TP}=1.5$ (V). Thereafter, the power supply voltage $V_{CC}$ further rises and, when it reaches or exceeds a value ($=3.3V$) which is determined by $\{(R_1+R_2)/R_2\}V_3=\{(1.8+1.5)/1.5\}\times 1.5$, the potential at the output terminal 3 becomes constant at $V_{REF}=3.3$ (V).

Here, the relation between the power supply voltage $V_{CC}$ and the reference potential $V_{REF}$ of the output when the power supply voltage $V_{CC}$ is 3.0 (V) or below is $V_{REF}=2$ ($V_{CC}-1.50$) (V).

The above relation indicates that, when the time period in which the power supply voltage $V_{CC}$ rises immediately after the power supply is switched to an on-state from an off-state is considered, the potential difference between the output reference potential $V_{REF}$ and the power supply voltage $V_{CC}$, which develops in the $2\Delta V_{TP}$ potential generating circuit during that time period is, as apparent from FIG. 2, larger than that when the $\Delta V_{TP}$ potential generating circuit is used. This means that to make the threshold voltage difference large by employing the $2\Delta V_{TP}$ potential generating circuit is effective in relation to the S/N ratio but results in a disadvantage in the point of ensuring the stable operation of other circuits during the period in which the power supply voltage becomes stable upon the switching-on of the power supply.

SUMMARY OF THE INVENTION

It is, therefore, an object of the present invention to overcome the problems existing in the conventional reference potential generating circuit and to provide an improved reference potential generating circuit which has an excellent capability of ensuring the stable operation of other circuits immediately after the switching-on of the power supply and which produces a reference potential that has a good S/N ratio and is stable when the power supply voltage reaches or becomes above the target output potential.

According to an aspect of the invention, there is provided a reference potential generating circuit of a type in which a reference potential is obtained by amplifying a threshold voltage difference of a plurality of MOS field effect transistors which have different threshold voltages, comprising a reference potential driver circuit which, during the period in which a power supply potential externally supplied is lower than a predetermined target value of the reference potential, drives an output terminal for producing a potential corresponding to the power supply potential supplied externally.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be explained with reference to the accompanying drawings. Throughout the following explanation, similar reference symbols or numerals refer to the same or similar elements in all figures of the drawings.

Figure 4:
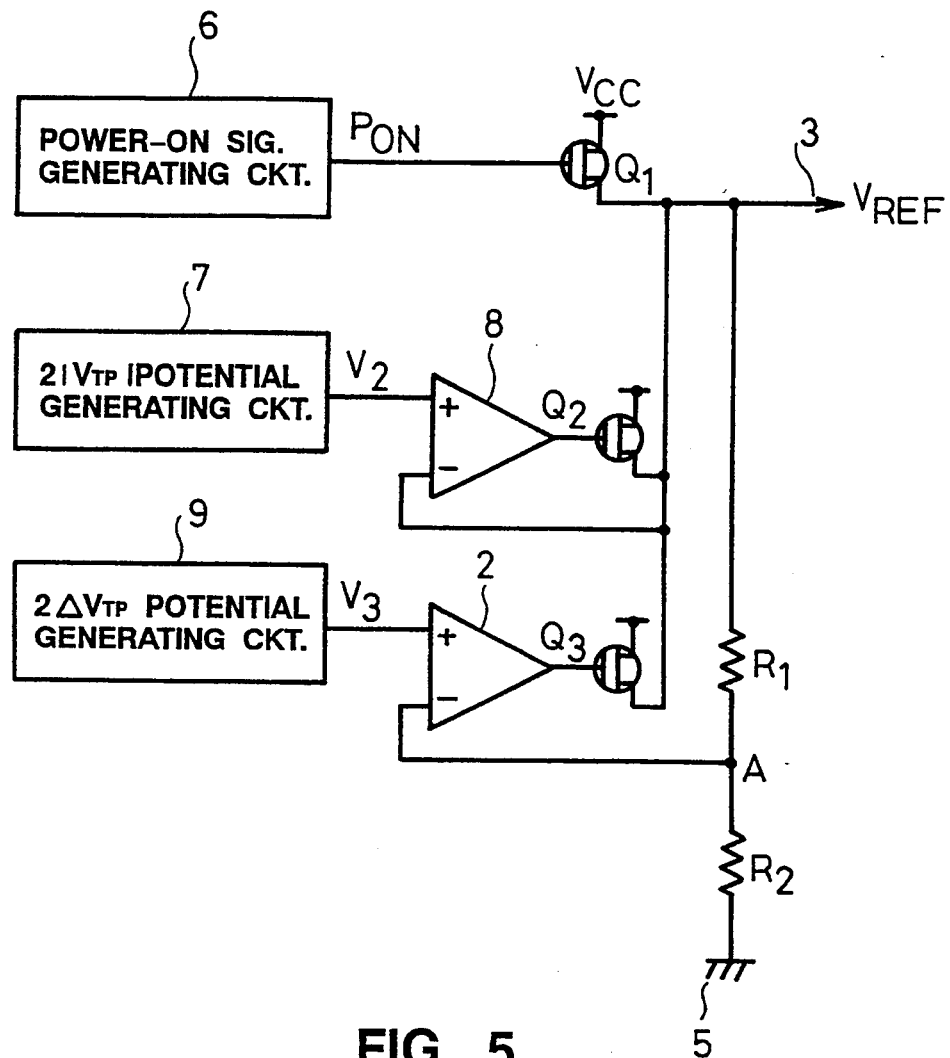
FIG. 4 is a circuit diagram showing a reference potential generating circuit of a first embodiment according to the invention.

FIG. 4 is a circuit diagram showing a reference potential generating circuit of a first embodiment according to the invention. As shown therein, the circuit includes a power-on signal generating circuit 6 which detects the switching-on of the power supply; a first driver PMOS transistor $Q_1$ which receives a power-on signal at its gate and drives an output terminal 3; a $2|V_{TP}|$ potential generating circuit 7 which produces a potential $V_2$ that is two times the threshold $|V_{TP}|$ of the PMOS transistor; a comparator 8 which compares the potential $V_2$ and the reference potential $V_{REF}$ of the output; a second driver PMOS transistor $Q_2$ which receives an output of the comparator 8 and drives the output terminal 3; a $2\Delta V_{TP}$ potential generating circuit 9 which produces a potential $V_3$ that is two times the threshold difference $\Delta V_{TP}$ between the two PMOS transistors having threshold voltages different from each other; resistors $R_1$ and $R_2$ which are connected in series between the output terminal 3 and the ground terminal 5 and which have resistance values $R_1$ ($\Omega$) and $R_2$ ($\Omega$), respectively; a comparator 2 which compares the potential $V_3$ and a potential at the series connection point A between the resistor $R_1$ and the resistor $R_2$, and a third driver PMOS transistor $Q_3$ which receives an output of the comparator 2 at its gate and drives the output terminal 3.

Figure 1A:
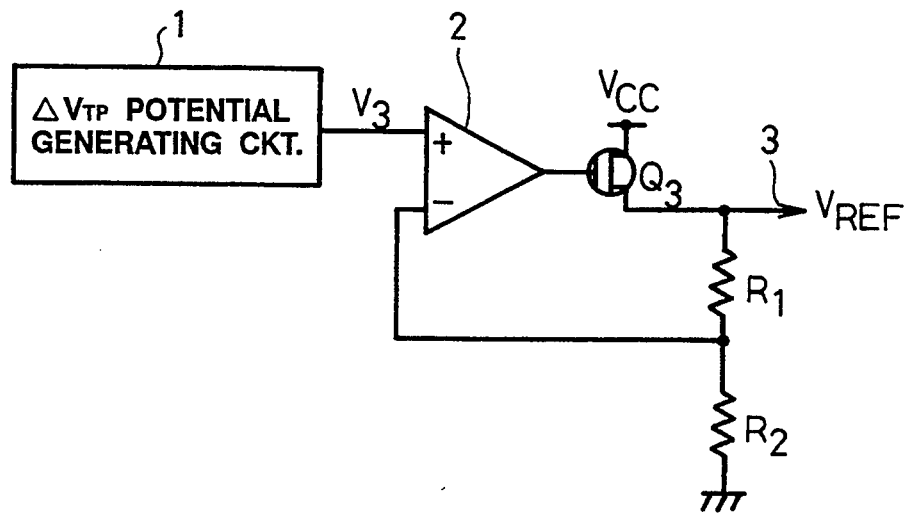
FIG. 1A is a circuit diagram showing a conventional reference potential generating circuit.
Figure 1B:
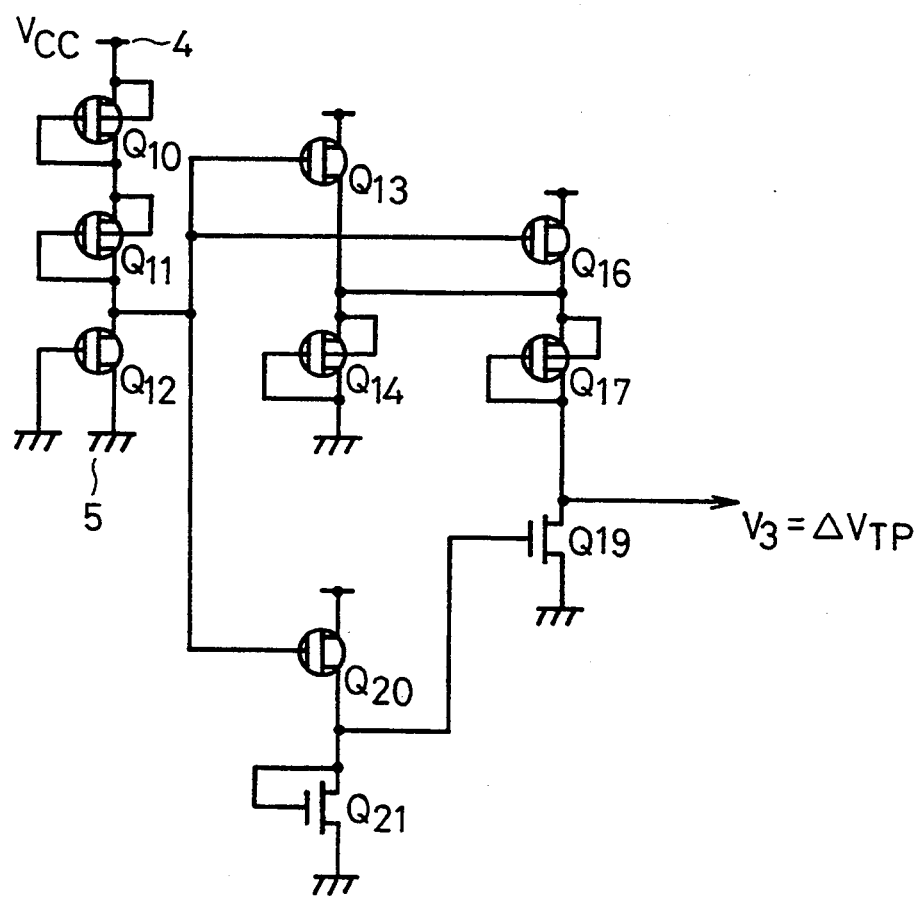
FIG. 1B is a circuit diagram showing a $\Delta V_{TP}$ potential generating circuit in the circuit shown in FIG. 1A.
Figure 2:
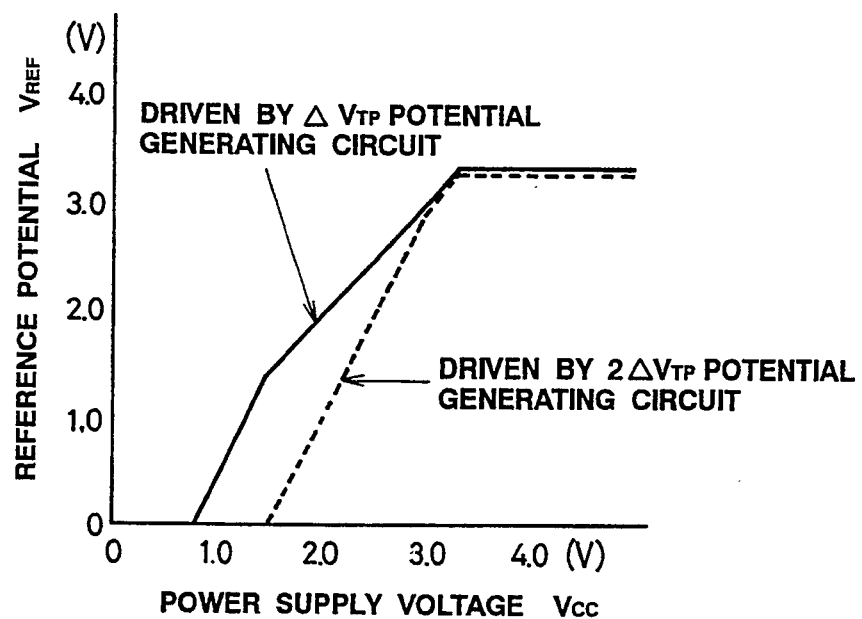
FIG. 2 is a graph showing the relation between the reference potential and the power supply voltage for explaining performance of the conventional reference potential generating circuit.
Figure 3:
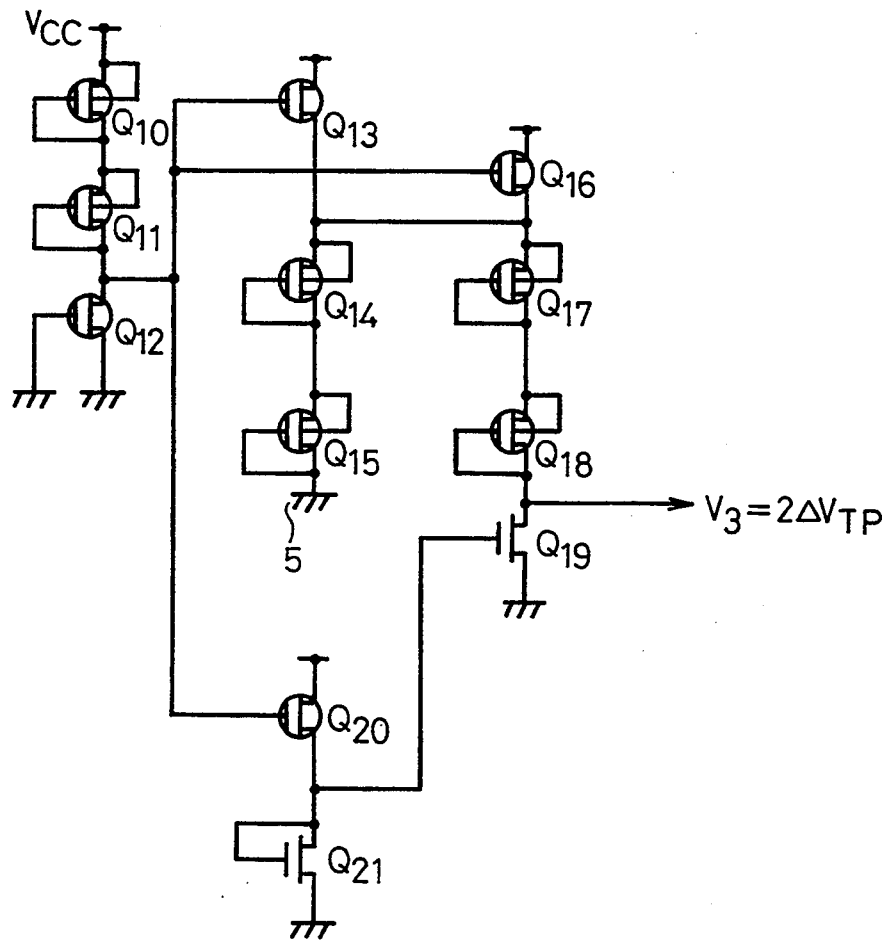
FIG. 3 is a circuit diagram showing a $2\Delta V_{TP}$ potential generating circuit used in the conventional potential generating circuit and in the circuit of the first embodiment according to the invention.

In this embodiment, the $2\Delta V_{TP}$ generating circuit 9 employed is the same circuit as that shown as the conventional circuit in FIG. 3.

Next, the $2|V_{TP}|$ potential generating circuit 7 is explained with reference to FIG. 5. In the circuit shown in FIG. 5, three PMOS transistors $Q_4$, $Q_5$ and $Q_6$ connected in series between the power supply terminal 4 and the ground terminal 5 produce a potential which is lower by two times the threshold voltage of the PMOS transistor than the power supply voltage $V_{CC}$. The potential thus produced is inputted to the gate of the PMOS transistor $Q_7$ and the potential $V_2$ is outputted from the drain of this PMOS transistor $Q_7$. The potential $V_2$ is a potential which is higher than the ground potential by the magnitude corresponding to the sum of the threshold voltages of the two PMOS transistors $Q_8$ and $Q_9$.

Figure 6A:
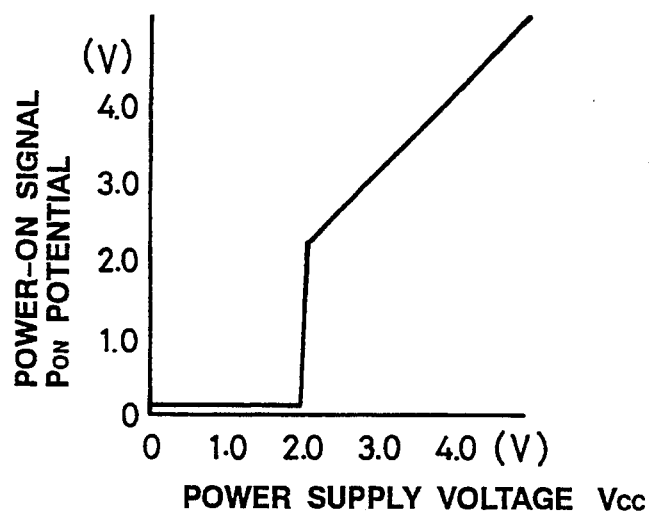
FIG. 6A is a graph showing the relation between the potential of a power-on signal and the power supply voltage in the circuit shown in FIG. 4.

In this embodiment, the power-on signal $P_{ON}$ produced by the power-on signal generating circuit 6 depends on the power supply voltage $V_{CC}$ as shown in FIG. 6A. That is, in the graph of FIG. 6A, until the power supply voltage $V_{CC}$ reaches a predetermined value (in this example, 2.0V) immediately after the power is switched on, the potential of the power-on signal $P_{ON}$ remains 0 (V). Then, at and above the predetermined value (=2V) of the power supply voltage $V_{CC}$, the potential of the power-on signal $P_{ON}$ becomes the same as that of the power supply voltage $V_{CC}$.

Figure 6B:
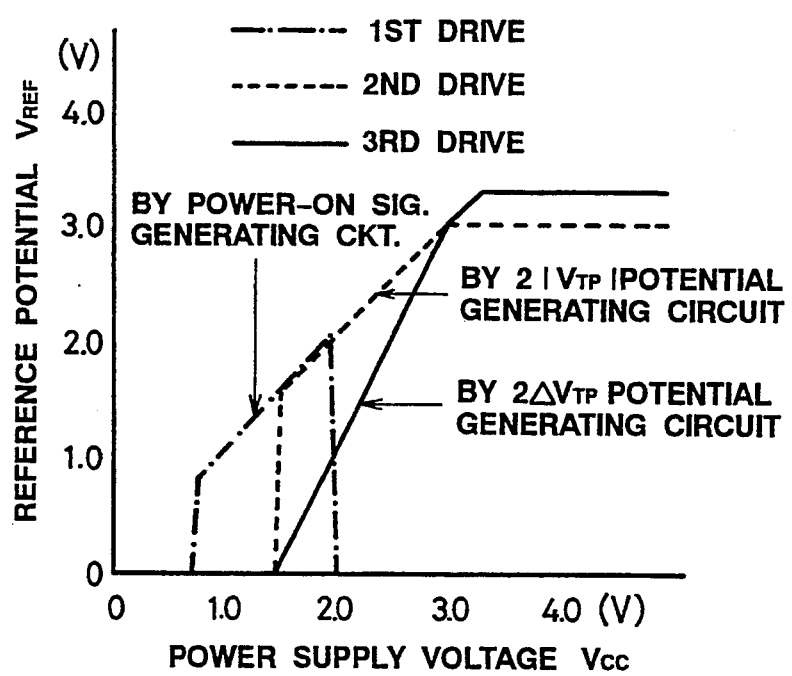
FIG. 6B is a graph showing the relation between the reference potential of the output and the power supply voltage for explaining performance of the circuit of the first embodiment according to the invention.

Hereunder, the operation of the circuit according to the above first embodiment will be explained in detail. FIG. 6B is a graph showing the relation between the reference potential $V_{REF}$ and the power supply voltage $V_{CC}$.

Figure 5:
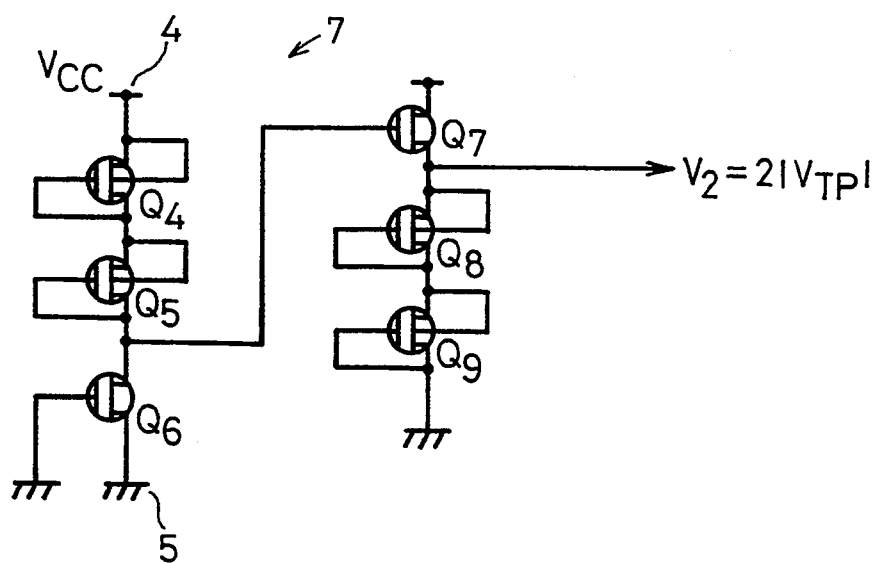
FIG. 5 is a circuit diagram showing a $2|V_{TP}|$ potential generating circuit in the circuit shown in FIG. 4.

In the $2|V_{TP}|$ potential generating circuit 7 shown in FIG. 5, the threshold voltage of each of the PMOS transistors $Q_6$, $Q_8$ and $Q_9$ is $-1.50$ (V) and that of other PMOS transistors is $-0.75$ (V). Also, in the $2\Delta V_{TP}$ potential generating circuit 9 shown in FIG. 3, the threshold voltage of each of the PMOS transistors $Q_{12}$, $Q_{14}$ and $Q_{15}$ is $-1.50$ (V) and that of other PMOS transistors is $-0.75$ (V) in the same way as above, and the resistance ratio between the resistor $R_1$ and the resistor $R_2$ is $R_1:R_1=1.8:1.5$. In this embodiment, the reason that the threshold voltage of the PMOS transistors $Q_6$ and $Q_{12}$ is made large is for reducing the current consumption involved.

First, consideration is given to the case wherein, in the present embodiment, the output terminal 3 is driven only by the third driver PMOS transistor $Q_3$ by the potential $V_3$ from the $2\Delta V_{TP}$ potential generating circuit 9.

In this case, the relation between the reference potential $V_{REF}$ and the power supply voltage $V_{CC}$ is as shown in a solid line in the graph of FIG. 6B. Specifically, as already explained, when the power supply voltage $V_{CC}$ is 3.0 V or below, the reference potential $V_{REF}$ is:

$$V_{REF}=2\cdot(V_{CC}-1.50)\ (V)$$

so that the value of the reference potential $V_{REF}$ becomes considerably lower than the value of the power supply voltage $V_{CC}$, which results in the lack of assurance for stable operation of other related circuits when the power supply voltage is low.

The problem is overcome by the provision of the second drive by the potential $V_2$ from the $2|V_{TP}|$ potential generating circuit 7. As shown by a dotted line in the graph of FIG. 6B, the reference potential $V_{REF}$ of the output terminal 3 driven by the second drive is:

$$V_{REF}=V_{CC}$$

when the power supply voltage $V_{CC}$ becomes 1.5 (V) or above which is the threshold voltage of the PMOS transistor $Q_6$ and becomes stable at $$V_{REF}=3.0\ (V)$$

when the power supply voltage $V_{CC}$ rises to 3.0 (V) or above.

On the other hand, as shown by a dashed line in the graph of FIG. 6B, the potential $V_{REF}$ of the output terminal which receives the power-on signal $P_{ON}$ from the power-on signal generating circuit 6 and which is driven by the first driver PMOS $Q_1$ is:

$$V_{REF}=V_{CC}$$

after the power supply voltage $V_{CC}$ rises from 0.75 (V), which corresponds to the threshold voltage of the PMOS transistor $Q_1$ until the power signal $P_{ON}$ becomes high (in this example, until $V_{CC}$ becomes $V_{CC}=2$ V).

In conclusion, in the reference potential generating circuit of this embodiment, when the power supply voltage $V_{CC}$ is in a range of 0.75 (V) $< V_{CC} <$ 3.30 (V), the reference potential $V_{REF}$ of the output will be $V_{REF}=V_{CC}$, and when the power supply voltage $V_{CC}$ is in a range of $V_{CC}>$ 3.30 (V), the reference potential of the output will be $V_{REF}=3.30$ (V).

It can be appreciated from the foregoing that the reference potential generating circuit of this embodiment has the same capability as in the conventional circuit as to the ensuring of stable operation of other related circuits immediately after the power supply is switched on and, in addition, has excellent characteristics as to the S/N ratio after the power supply voltage has reached a predetermined value.

Figure 7:
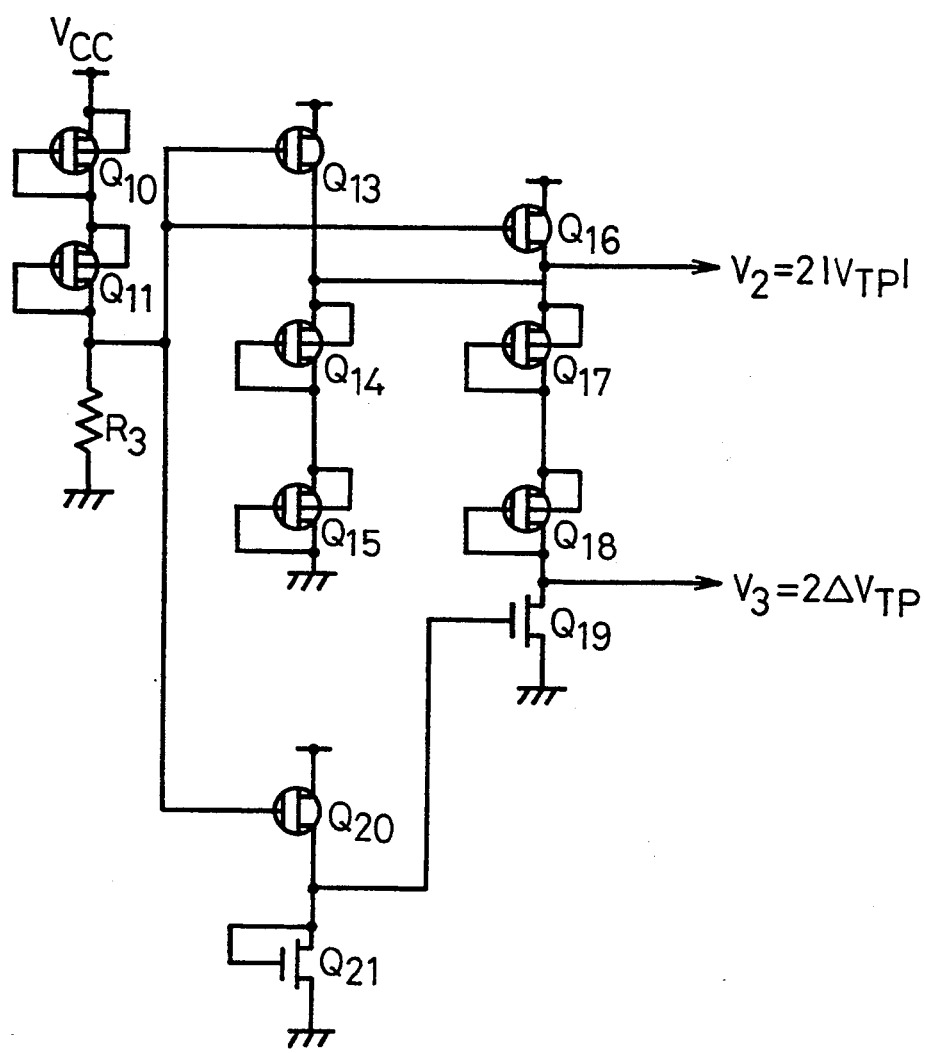
FIG. 7 is a circuit diagram showing a circuit which produces a potential $V_2$ and a potential $V_3$.

Next, an explanation is made of a second embodiment according to the present invention. FIG. 7 is a circuit diagram of a circuit for obtaining a potential $V_2$ and a potential $V_3$ according to this second embodiment. In this embodiment as shown in FIG. 7, the $2|V_{TP}|$ potential generating circuit and the $2\Delta V_{TP}$ potential generating circuit are not separately prepared and, instead, in the $2\Delta V_{TP}$ potential generating circuit as shown in FIG. 3, a potential which is produced in the course of obtaining the potential $V_3$ of $2|V_{TP}|$ is used as $2|V_{TP}|=V_2$, and this contributes to the simplification of the circuit configuration involved.

Also, in the circuit of this embodiment, the PMOS transistor $Q_{12}$ shown in the circuit of FIG. 3 has been replaced by a resistor $R_3$ so that, when the power supply voltage $V_{CC}$ rises to or above the threshold voltage of each of the PMOS transistors $Q_{13}$, $Q_{16}$ and $Q_{20}$, the output terminal 3 is driven such that a potential is caused to be equal to the power supply voltage $V_{CC}$ also by the second drive of the potential $V_2$.

As explained above, the reference potential generating circuit according to the present invention is provided with a circuit which drives an output terminal in such a way that the power supply voltage and the internal reference potential are caused to be equal to each other when the power supply voltage is lower than the target value of the internal reference voltage. Thus, the circuit for setting the target value of the internal reference potential can be designed without the need of consideration as to circuit performance when the power supply voltage is low but only with the consideration as to circuit capability when the power supply voltage rises from the target value of the internal reference potential. Therefore, the present invention can provide an improved reference potential generating circuit in which the S/N ratio is good and the circuit operation is stable. This is a very significant advantage for reducing the power consumption and for increasing the integration density in semiconductor integrated circuit devices.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A reference potential generating circuit comprising:
    a reference potential output terminal;
    a first driver circuit for producing a reference potential at said reference potential output terminal, said first driver circuit including a difference potential generating circuit for generating a difference potential between threshold voltages of a plurality of MOS field effect transistors having different threshold voltages, and a comparator amplifier for differently amplifying said difference potential generated by said difference potential generating circuit and a potential produced by a division of said reference potential; and
    a second driver circuit for producing at said reference potential output terminal a potential equaling an increasing power supply voltage during a transient period in which a power supply voltage externally supplied is lower than said reference potential after switching-n of said power supply, said second driver circuit including a sum threshold potential generating circuit for producing a potential of a sum of threshold voltages of a plurality of MOS field effect transistors and a comparator for comparing said potential of the sum of threshold voltages with said reference potential.

2. A reference potential generating circuit according to claim 1, further comprising a third driver circuit for producing at said reference potential output terminal a potential equaling the increasing power supply voltage during said transient period after switching-on of power supply, said third driver circuit including a power-on signal generating circuit for detecting the switching-on of said power supply and generating a power-on signal and a driving circuit for driving, in accordance with said power-on signal from said power-on signal generating circuit, said reference potential output terminal with a potential equaling the increasing power supply voltage.

* * * * *

UNITED STATES PATENT AND TRADEMARK OFFICE
CERTIFICATE OF CORRECTION

PATENT NO. : 5,361,000
DATED : November 1, 1994
INVENTOR(S) : Koshikawa, et al.

It is certified that error appears in the above-indentified patent and that said Letters Patent is hereby corrected as shown below:

Column 7, line 23, delete "termlnal", insert --terminal--.

Column 8, line 26, delete "switching-n", insert --switching-on--.

Signed and Sealed this

Seventh Day of March, 1995

*Attest:*

BRUCE LEHMAN

*Attesting Officer*    *Commissioner of Patents and Trademarks*